United States Patent [19]

Meyer et al.

[11] Patent Number: 4,588,907
[45] Date of Patent: May 13, 1986

[54] INTEGRATED DIGITAL MOS SEMICONDUCTOR CIRCUIT

[75] Inventors: Willibald Meyer; Jürgen Warwersig, both of Munich, Fed. Rep. of Germany

[73] Assignee: Siemens Aktiengesellschaft, Berlin & Munich, Fed. Rep. of Germany

[21] Appl. No.: 610,092

[22] Filed: May 14, 1984

[30] Foreign Application Priority Data

May 20, 1983 [DE] Fed. Rep. of Germany ....... 3318564

[51] Int. Cl.$^4$ ........................................... H03K 17/693
[52] U.S. Cl. .................... 307/441; 307/453; 307/468; 307/354; 307/219; 307/290
[58] Field of Search .................... 324/73 R, 73 AT; 307/448, 453, 465, 468, 469, 481, 482, 350, 351, 530, 354, 362, 363, 571, 573, 577, 578, 582, 583, 279, 290, 202.1, 219, 441

[56] References Cited

U.S. PATENT DOCUMENTS

| | | | |
|---|---|---|---|
| 4,071,784 | 1/1978 | Maeder et al. | 307/290 X |
| 4,229,670 | 10/1980 | Thommen et al. | 307/362 X |
| 4,318,013 | 3/1982 | Thomas et al. | 307/362 |
| 4,350,906 | 9/1982 | Gillberg | 307/469 |
| 4,379,974 | 4/1983 | Plachno | 307/290 X |
| 4,428,071 | 1/1984 | Wilmsmeyer et al. | 307/362 X |
| 4,446,534 | 5/1984 | Smith | 307/202.1 X |
| 4,480,199 | 10/1984 | Varshney et al. | 307/202.1 X |

Primary Examiner—Stanley D. Miller
Assistant Examiner—D. R. Hudspeth
Attorney, Agent, or Firm—Hill, Van Santen, Steadman & Simpson

[57] ABSTRACT

For integrated digital MOS semiconductor circuits having redundant circuit parts, particularly for semiconductor memories having redundant rows and columns, it is desirable after the employment of the redundant circuit parts to be able to distinguish such a module from those modules in which such an employment of redundant circuit parts has not yet occurred. According to the invention, signals are enabled which serve for the normal mode as well as for the test mode to be input into the circuit via the same signal input. Test signals are distinguished from the other signals by an elevated signal level. The circuit according to the invention includes a circuit part to be activated by means of interrupting a conductive connection, said circuit part then distinguishing the signals applied to the input from one another on the basis of their levels and generating secondary signals on the basis of the signals having the elevated level, said secondary signals then being provided for the control of the test mode.

7 Claims, 5 Drawing Figures

INTEGRATED DIGITAL MOS SEMICONDUCTOR CIRCUIT

BACKGROUND OF THE INVENTION

The present invention relates to an integrated digital MOS semiconductor circuit which has an input to be charged by signals having differing levels. A first operating mode can be initiated on the basis of the signals having one level and a second operating mode can be initiated with a second level upon simultaneous shutdown of the other operating mode under given conditions.

Such a design of an integrated digital MOS semiconductor circuit would be of significance, for example, for integrated MOS semiconductor memories having redundant rows and columns—particularly for dynamic memories of this type. As known, the matrix of such memories comprises additional rows and columns which are initially not provided for the normal operation of the memory. When, however, a malfunction occurs at a memory cell provided for normal operation, then there is the possibility of replacing the row or column containing the malfunctioning cell with a redundant row or column. The redundant row or column is then made accessible for normal operation from which it had initially been inhibited by means of a corresponding manipulation whereas, on the other hand, the row or column containing the malfunctioning cell is permanently shut down. For this purpose, it is standard to keep the redundant rows and columns from responding during normal operation by means of disconnectible connections. The activation of the redundant row or column then likewise occurs by means of cutting these short-circuit connections. It is thus frequently necessary to have a possibility available for the recognition of those rows and columns of the memory matrix that have been replaced by a redundant row or column.

German patent application P 33 11 427.7, incorporated herein by reference, discloses an integrated dynamic write/read memory that is designed such that the replacement of a row or column of the memory matrix that is provided for normal operation by a redundant row or column is detected by means of a logic level at the data output given a charging with control signals that corresponds to the so-called roll-call mode in static memories. The possibility then exists of applying such control signals for testing to signal connections of the memory circuit that are especially provided therefor. This, however, leads to an added expense of terminal pins for the IC module containing the memory which is undesirable for known reasons. However, differently set signals can also be employed for the normal mode on the one hand and for the test mode on the other hand, these being applied to a common external signal input. When one has signals of the one level, these lead to the one operating mode and when one has signals of the other level, then these automatically lead to the other operating mode as a consequence of a corresponding internal layout of the integrated circuit. Required for this purpose is a changeover system effecting the changeover which automatically determines on the basis of a signal applied to the common external signal input to be charged by the two types of signals whether the applied signal is intended for the normal mode or for the test mode. On the basis of this signal, a corresponding internal setting of the circuit to the test mode or to the normal mode occurs.

The circuit parts in the integrated circuit that are provided for the test functions can, for example, thus be activated in that a signal input electrode which is internally connected in the manner indicated for the test mode is charged with a signal voltage that is higher than the normal operating voltage of the IC module. It must thereby be assured, however, that the test function cannot be initiated by a signal voltage provided for the normal operation at the signal connection. On the other hand, the voltage for the test signal must still lie below the maximum allowable voltage charge of the integrated circuit for understandable reasons. Furthermore, a current flux across the input should be avoided when the input is connected to the test signal. It is also desirable for the test mode to occur only when circuit parts provided for the normal mode have been previously replaced in the module by redundant circuit parts, so that an absolute shutdown of the circuit parts provided for the test mode previous thereto is provided. The possibility thus results that, given ICs equipped with redundancy and designed identically to one another circuit-wise, those where redundant parts have already been engaged into the normal mode can be distinguished in a simple manner from those where this is not the case.

SUMMARY OF THE INVENTION

According to the invention, the signal input to be charged with the two types of signals is connected to the gate of a first MOS field effect transistor whose drain is connected to the supply potential and whose source is connected via the source-drain portion of a second MOS field effect transistor to the input of a Schmitt trigger on the one hand and to the drain of a third MOS field effect transistor on the other hand, the gate thereof lying at supply potential and its source lying at reference potential. The output of the Schmitt trigger serves for the control of the first input of an output amplifier circuit provided with two inputs which in turn lies both at the supply potential as well as at the reference potential, and whose second input is controlled by means of a circuit part comprising a series connection of two further MOS field effect transistors, a disconnectible connection, and an AND gate having two inputs. A fifth MOS field effect transistor in this circuit part has its source terminal applied to the reference potential and its drain terminal applied via the disconnectibly designed connection to both the one input of the AND gate as well as to the source terminal of a fourth MOS field effect transistor whose drain terminal lies at supply potential. Furthermore, a first clock signal is provided for the control of the fifth MOS field effect transistor, a second clock signal is provided for the control of the fourth MOS field effect transistor, and a third clock signal is provided for the control of the second input of the AND gate. The output of the AND gate serves for the control of the second MOS field effect transistor on the one hand as well as for the control of the second input of the output amplifier. Finally, the signal appearing at the output of the output amplifier serves for the activation and/or control of further parts of the MOS semiconductor circuit.

DESCRIPTION OF THE PREFERRED EMBODIMENTS

Figure 1:
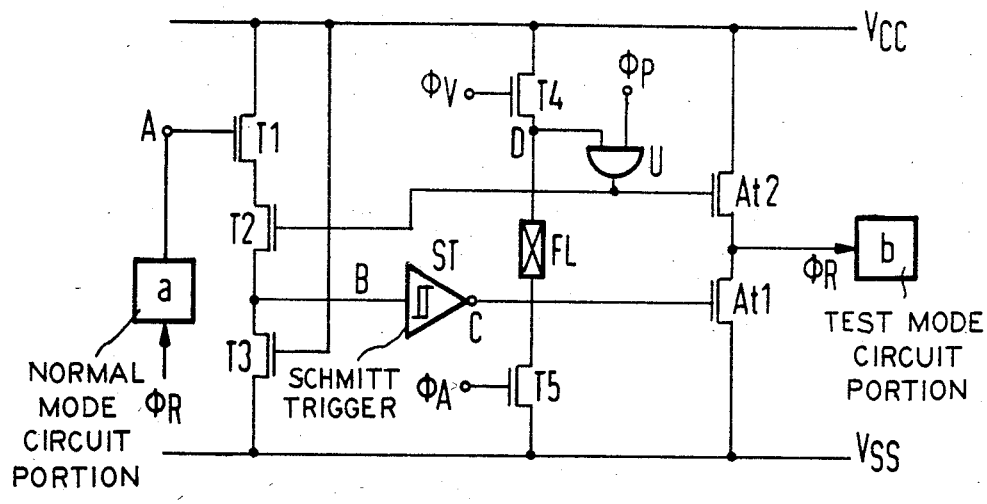
FIG. 1 is a simplified illustration of the integrated digital MOS semiconductor circuit according to the invention.

Given the circuit diagram of a first execution of the circuit of the invention illustrated in FIG. 1, one finds the circuit part (the threshold switch) to be charged with two signal types (A) having differing levels and also finds the circuit part a provided for normal operation. The circuit part a serves for the normal or use mode of the circuit and the circuit part b serves for the test mode. The test circuit b is activated by the signals $\phi_R$ to be generated. At the same time, the signals $\phi_R$ can be employed to deactivate the circuit part a provided for the normal mode.

According to the definition of the invention, then, a first MOS field effect transistor T1 has its gate lying at the signal connection A, its drain lying at the supply potential $V_{cc}$, and its source terminal lying via the source-drain segment of a second MOS field effect transistor T2 at the input B of a Schmitt trigger ST on the one hand and, via the source-drain segment of a third MOS field effect transistor, at the reference potential $V_{ss}$ on the other hand. The gate of the third transistor T3 is directly connected to the supply potential $V_{cc}$, whereas the gate of the second MOS field effect transistor T2 is controlled by the output of an AND gate U.

Figure 3:
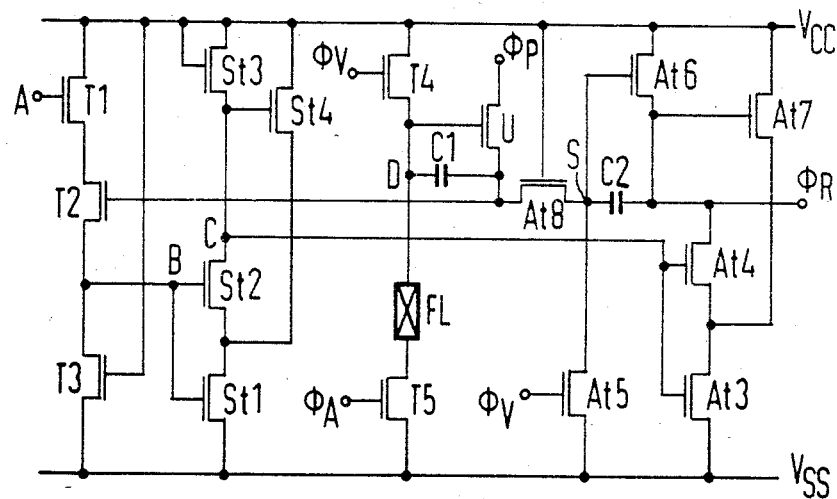
FIG. 3 is a schematic illustration of a further development of the inventive system shown in FIG. 1.

It should be pointed out at this juncture that the transistors employed in the circuit in the exemplary embodiment shown in FIG. 1 and in FIG. 3 are all self-inhibiting and of the same channel type, particularly of the n-channel type. It should also be pointed out regarding the AND gate that this, as may likewise be seen from FIG. 3, can be realized by means of a single MOS field effect transistor of the self-inhibiting type.

Given the embodiment of the invention shown in FIG. 1, the output amplifier is provided by two output transistors $At_1$ and $At_2$ lying in series, whereby the field effect transistor $At_1$ has its source terminal lying at reference potential $V_{ss}$ and the field effect transistor $At_2$ has its drain terminal lying at the supply potential $V_{cc}$. Together, the source terminal of the transistor $At_2$ as well as the drain terminal of the transistor $At_1$ form the output supplying the desired signal $\phi_R$.

The output C of the Schmitt trigger ST serves for charging the gate of the transistor $At_1$ in the output amplifier that lies at the reference potential $V_{ss}$. By contrast, the output of the AND gate U which, as already mentioned, serves for the control of the gate of the second MOS field effect transistor T2, is provided for the control of the gate of the transistor $At_2$ lying at supply potential.

A fifth MOS field effect transistor T5 corresponding to the definition of the invention which is controlled at its gate by a first clock signal $\phi_A$, has its source terminal lying at the reference potential $V_{ss}$, and has its drain terminal—via the interposition of a disconnectible connection FL—lying both at the one input of the AND gate U as well as at the source terminal of the fourth MOS field effect transistor T4. The drain terminal of transistor T4 lies at the supply post for the supply potential $V_{cc}$ and its gate is controlled by a second pulse sequence. A third pulse sequence $\phi_p$ serves for the control of the second input of the AND gate U.

The circuit described according to FIG. 1 differs from the circuit according to FIG. 3 since the embodiment according to FIG. 3 is provided with a more complicated embodiment of the output amplifier as well as an embodiment of the Schmitt trigger ST as well as the aforementioned realization of the AND gate U with a MOS field effect transistor. These possibilities according to FIG. 3 shall be described first.

Similarity with the embodiment according to FIG. 1 can be seen with respect to the circuit and control of the transistor chain T1, T2, and T3 with the signal input A.

Given the embodiment of the Schmitt trigger ST employed in FIG. 3, four MOS field effect transistors $St_1$ through $St_4$ are provided, whereby the gate of the first of these transistors, namely the transistor $St_1$, as well as the gate of the second transistor $St_2$, represent the signal input B of the Schmitt trigger. The first of these transistors $St_1$ has its source terminal at the reference potential $V_{ss}$ and has its drain connected to the source terminal of the second of these transistors $St_2$. The drain of transistor $St_1$ also connects to the supply potential $V_{cc}$ via the source-drain portion of the fourth transistor $St_4$. The third transistor $St_3$ has its source applied both to the signal output C of the Schmitt trigger as well as to the gate of the fourth transistor $St_4$, and has its gate and its drain applied to the supply potential $V_{cc}$.

There is a similarity between the two FIGS. 1 and 3 with respect to the circuit of the fifth transistor T5 and the fourth transistor T4 according to the invention. They are similarly controlled by the first clock signal $\phi_A$ and by the second clock signal $\phi_v$ and also employ the disconnectible connection FL. A MOS field effect transistor is provided for the realization of the AND gate U, the drain terminal, thereof being charged by the third pulse sequence $\phi_p$. Its source terminal, which represents the output of the AND gate, is directly applied to the gate of the second transistor T2 and is also connected via a capacitor C1 to the source terminal of the transistor T4 and thus to its own gate. Finally, the output of the AND gate U lies at the input of the amplifier circuit at the output of the overall circuit which, for example, can also be designed in accordance with FIG. 1 ($At_1$, $At_2$).

Given the embodiment of the invention illustrated in FIG. 3, however, the output amplifier is also designed as a Schmitt trigger circuit which is combined with a bootstrap circuit in this case. Six MOS field effect transistors $At_3$–$At_8$ and one capacitor C2 are provided, as discussed hereafter.

The one input of the output amplifier charged by the output of the AND gate U is given by the one current-conducting terminal of the transistor $At_8$ whose gate is at supply potential $V_{cc}$ and whose other current-conducting terminal is at a circuit node S. Via the source-drain segment of the MOS field effect transistor $At_5$ which is controlled at its gate by the second clock pulse $\phi_v$ (also employed at the same time for the control of T4), this circuit node S leads to the reference potential $V_{ss}$. It also leads via the capacitor C2 to the signal output of the output amplifier supplying the desired pulses $\phi_R$. Finally, this node S is also connected to the gate of the transistor $At_6$ whose source terminal is at the signal output and whose drain is at the supply potential $V_{cc}$. It should also be noted that the output of the AND gate U and thus the input of $At_8$ also is connected at the node D via a bootstrap capacitor C1.

In this case, the output C of the Schmitt trigger St is connected to the gate of the MOS field effect transistor $At_3$ whose source is directly connected to the reference potential $V_{ss}$. Output C also connects to the gate of the MOS field effect transistor $At_4$ lying in series with the transistor $At_3$, and whose drain terminal connects to the signal output $\phi R$. A circuit point between the two latter transistors $At_3$ and $At_4$ is at the supply potential $V_{cc}$ via the source-drain portion of the MOS field effect transistor $At_7$, whereas the gate of transistor $At_7$ is directly connected to the output $\phi R$ of the output amplifier.

Figure 4:
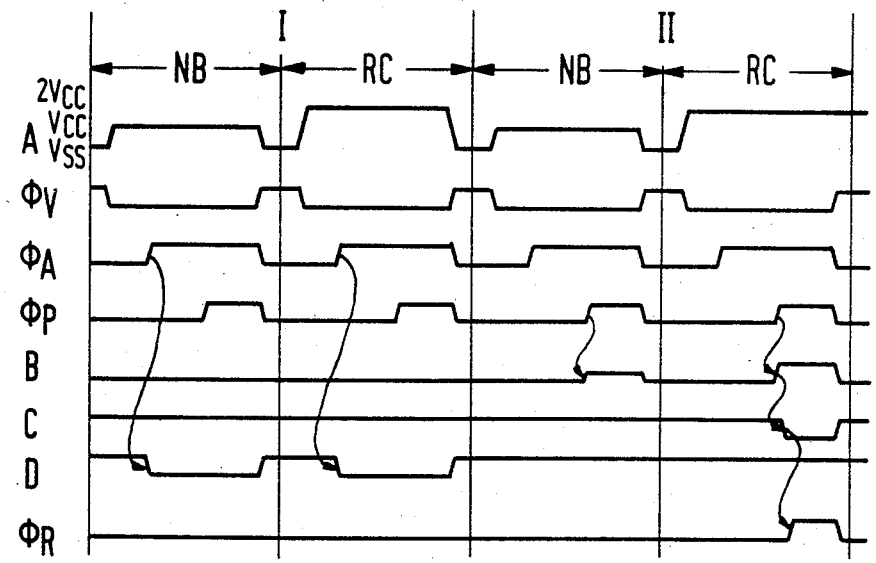
FIG. 4 is a graph illustrating the time behavior of pulses required for charging of the circuit according to the invention in coordination with a control signal at the signal input.

FIG. 4 shows charging of the signal input A as well as the chronological progression of the pulses $\phi_v$ (equals second clock pulse), $\phi_A$ (equals first clock pulse), and $\phi_p$ (equals third clock pulse). FIG. 4 also shows the status at input B, the status at output C of the Schmitt trigger St, the status at the source terminal of the fourth transistor T4 at point (D) connected to the AND gate U, and the status at the output $\phi R$, that is the chronological progression of the pulses to be generated. Before discussing the details in this regard, however, the behavior of the circuit according to FIG. 1 or according to FIG. 3 shall first be discussed in detail.

The clock signal $\phi_v$ serving for the control of the fourth transistor T4 (i.e. the second clock signal according to the definition of the invention) serves for charging the input of the AND gate U controlled by this transistor to the voltage value $(V_{cc}-U_T)$ ($U_T$=threshold voltage of T4). The first clock signal $\phi_A$ serving for the control of the fifth transistor goes from the value of the reference potential $V_{ss}$ to the value of the supply potential $V_{cc}$ after the clock signal $\phi_v$ has been switched to the value $V_{ss}$. The input of the AND gate U controlled by T4 is thus discharged again insofar as the connection between T5 and T4 (FL) is still intact.

In case the connection is cut, however, the effect of the clock signal $\phi_A$ on the AND gate U is eliminated.

It should be noted in the case of the third clock signal $\phi_p$ serving for the charging of the AND gate U, that its leading edge defines the leading edge of the output signal $\phi_R$ as soon as the signal with the elevated level (i.e. the level lying above $V_{cc}$) is pending at the signal input A of the circuit. The clock signals $\phi_A$ and $\phi_p$ can both expediently be reset to the reference potential $V_{ss}$ with the leading edge of the signal $\phi_v$.

Figure 2:
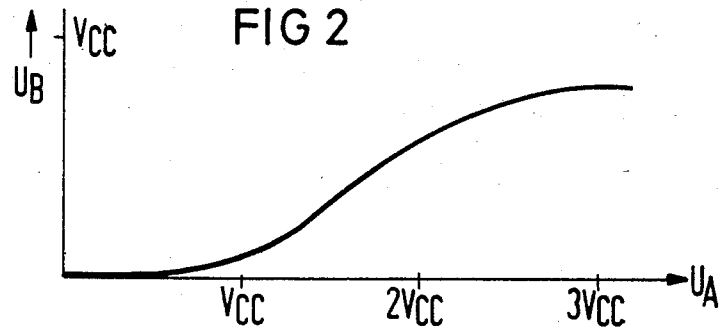
FIG. 2 is a graph showing the response behavior to the voltage level applied to the signal input in FIG. 1.

The series connection of the transistors T1, T2, and T3 which is controlled by the signal input A between the second transistor T2 and the third transistor T3 and thus at the input B of the Schmitt trigger St, results in voltage $U_B$ to be seen from FIG. 2 between the point B and the reference potential $V_{ss}$. This is a function of the voltage value $U_A$ at the signal input A referenced to the reference potential $V_{ss}$. The steepness of the curve can be set by dimensioning transistors T1-T3. The behavior shown in FIG. 2 corresponds to optimum dimensioning. It is desired that the threshold of the Schmitt trigger ST is reached when the voltage $U_A$ at the signal input A lies between the single value and twice the value of the supply voltage $V_{cc}$.

The third clock signal $\phi_p$ can have an influence on the combination of the transistors T1 through T3 via the second transistor T2 under the influence of the AND gate U, whereby the power consumption in the circuit shown in FIGS. 1 and 3 is restricted to the active time spans of the work cycle of the circuit. The clock $\phi_p$ can obviously not pass the AND gate U as long as the disconnectible connection FL is still intact. In this case, the connection existing between T4 and the AND gate U, i.e. the node D is locked onto the potential value $V_{ss}$ at the beginning of an active cycle via the fifth transistor T5 and the disconnectible connection FL. The second clock $\phi_v$ and the fourth transistor T4 controlled by the second clock then see to it that a precharging of the node D occurs. In this operating condition, forward currents can likewise not exist so that the power consumption of the circuit for generating the signals $\phi_R$ which is shown in FIGS. 1 and 3 becomes negligibly small. The appearance of an output signal $\phi_R$ is then impossible. When the disconnectible connection FL is then interrupted, a voltage, for example $U_A=2V_{cc}$, which is dimensioned sufficiently high, and which is applied to the signal input A as signal voltage $U_A$, produces the output signal that can be utilized for the activation of a hitherto inactive circuit part b, for example a test circuit. This is utilized, for example, as shown in FIG. 1 wherein the circuit part b serving for the test mode is switched to its active condition by means of the signals $\phi_R$. When desirable, the charging of the circuit part a provided for the normal mode by the signal input A can be prevented without circuitry complications by means of the clock $\phi_R$.

One can see from the charging of a circuit according to FIG. 1 and FIG. 3 as shown in FIG. 4 that the level present at the signal input A can assume values between $V_{ss}$ and $V_{cc}$ in the normal mode and values between $V_{cc}$ and $2V_{cc}$ in the test mode. Since the allowable gate voltage of the transistors in digital integrated n-channel MOS circuits usually amounts to at least twice the maximum operating voltage, circuit dangers do not exist given such a charging of the signal input A.

The time behavior for the normal mode is shown in the diagram according to FIG. 4 in the columns referenced NB and the time behavior for the test mode is shown in the columns referenced RC.

Figure 1A:
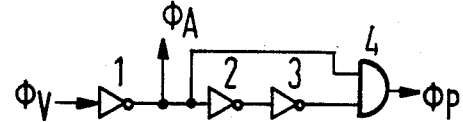
FIG. 1A is a schematic illustration of circuitry for providing various clock signals utilized in FIG. 1.

In order to obtain the clock sequences $\phi_v$, $\phi_A$ and $\phi_p$ exhibiting the desired time behavior, the simplest manner is to proceed from the second pulse sequence $\phi_v$ and to charge the circuit shown in FIG. 1a accordingly. The circuit comprises a first inverter 1 whose input is charged with the pulses $\phi_v$ and whose output supplies the pulses $\phi_A$. The output of the first inverter also controls the input of a second inverter 2 as well as the one input of an AND gate 4. The second input of this AND gate 4 is controlled by the output of a third inverter 3 which in turn lies at the output of the second inverter 2. The output of the AND gate 4 supplies $\phi_p$.

Although various minor changes and modifications might be proposed by those skilled in the art, it will be understood that we wish to include within the claims of the patent warranted hereon all such changes and modifications as reasonably come within our contribution to the art.

We claim as our invention:

1. In an integrated digital MOS semiconductor circuit having a signal input to be connected to signals at different levels whereby a first operating mode can be initiated with signals having a first level and a second operating mode can be initiated with signals having a second level upon simultaneous shutdown of the other respective operating mode under given conditions, whereby the improvement comprises:

the signal input being connected to a gate of a first MOS field effect transistor whose drain is at a supply potential and whose source is connected via a source-drain path of a second MOS field effect transistor to an input of a Schmitt trigger and to a drain of a third MOS field effect transistor whose gate is at said supply potential and whose source is at a reference potential;

an output of the Schmitt trigger being connected to control a first input of an output amplifier which itself is connected both to the supply potential as well as to the reference potential, and a second input of the output amplifier being controlled by an AND gate having a first input connected between fourth and fifth MOS field effect transistors, the AND gate output also being connected to control the second MOS field effect transistor;

the fifth MOS field effect transistor having its source terminal connected to the reference potential and its drain terminal connected via a fusible connection to both the first input of said AND gate as well as to the source terminal of said fourth MOS field effect transistor whose drain terminal is connected to the supply potential;

a first clock signal connected to control the fifth MOS field effect transistor, a second clock signal connected to control the fourth MOS field effect transistor, and a third clock signal connected to control a second input of the AND gate; and a signal appearing at a signal output of the output amplifier being connected to control further portions of the MOS semiconductor circuit.

2. A semiconductor circuit according to claim 1 wherein the second transistor has its gate directly connected to the output of the AND gate.

3. A semiconductor circuit according to claim 1 wherein the output amplifier comprises a series connection of two MOS field effect transistors, a source terminal of the one transistor being at the reference potential and its gate connected to the output of the Schmitt trigger, a drain terminal of the other transistor being connected to the supply potential and its gate being connected to the output of the AND gate; and the signal output being provided between the two field effect transistors.

4. A semiconductor circuit according to claim 1 wherein the output amplifier comprises: five MOS field effect transistors and a capacitor; the second input of the output amplifier connecting to the AND gate and comprising a source-drain path of a first of the five transistors whose gate is at the supply potential; a source-drain path of a second transistor controlled by the second clock signal connecting the first transistor source-drain path opposite the input to the reference potential; a gate of a third transistor whose source-drain path is between the supply potential and the signal output of the amplifier connecting to the signal output via said capacitor; the signal output connecting to the reference potential via a series connection of fourth and fifth transistors; gates of the fourth and fifth transistors which comprise the output amplifier first input being connected to the output of the Schmitt trigger; a circuit point between the fourth and the fifth transistors being connected to the supply potential via a source-drain path of a sixth transistor; and a gate of the sixth transistor connected to the output of the amplifier.

5. A semiconductor circuit according to claim 1 wherein the AND gate comprises a MOS field effect transistor whose gate is connected to the source terminal of the fourth transistor, whose drain connects to the third clock sequence, and whose source is connected to the gate of the second field effect transistor and to the second input of the output amplifier.

6. A semiconductor circuit according to claim 1 wherein the Schmitt trigger is formed by four MOS field effect transistors and wherein the input of the Schmitt trigger comprises gates of a first and of a second of the transistors which are connected in series with one another, the first transistor having its source-drain path at reference potential and the second transistor having its source-drain path connected to the output of the Schmitt trigger; the output of the Schmitt trigger being connected to the supply potential via a third of the transistors connected as a resistor; a circuit point between the first and second transistors connecting to the supply potential via a fourth of the transistors; and a gate of said fourth further transistor connecting at the output of the Schmitt trigger.

7. An integrated digital MOS semiconductor system, comprising:

a normal operating mode circuit portion having signals of differing levels output therefrom whereby a first operating mode can be initiated with signals having a first level and a second operating mode can be initiated with signals having a second level upon simultaneous shutdown of the other respective operating mode;

a signal input connected to receive said signals of differing levels;

said signal input being connected to a gate of a first transistor having one end of its source-drain path connected to a supply potential and the other end through second and third transistors to a reference potential;

a gate of the second transistor connecting to a second of first and second inputs of the output amplifier;

a gate of the third transistor connecting to the supply potential;

a junction of the second and third transistors connecting through a Schmitt trigger to the first input of the output amplifier;

fourth and fifth transistors with a fusible connection therebetween;

an AND gate having a first input connected to the fourth transistor and an output connecting to the second input of the output amplifier;

a first clock signal connecting to control the fifth transistor, a second clock signal connecting to control the first transistor, and a third clock signal connecting to the second input of the AND gate; and an output of the output amplifier connecting to control a test circuit mode circuit portion.

* * * * *